(12) United States Patent
Horng et al.

(10) Patent No.: US 9,049,080 B2
(45) Date of Patent: Jun. 2, 2015

(54) INJECTION-LOCKED RF RECEIVER HAVING TRIFILAR TRANSFORMER SPLITTER

(71) Applicant: NATIONAL SUN YAT-SEN UNIVERSITY, Kaohsiung (TW)

(72) Inventors: Tzyy-Sheng Horng, Kaohsiung (TW); Rong-Fu Ye, Kaohsiung (TW); Jian-Ming Wu, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 289 days.

(21) Appl. No.: 13/870,433

(22) Filed: Apr. 25, 2013

(65) Prior Publication Data

US 2014/0140443 A1    May 22, 2014

(30) Foreign Application Priority Data

Nov. 19, 2012   (TW) .............................. 101143013 A

(51) Int. Cl.

| H04L 27/14 | (2006.01) |
|---|---|
| H03B 5/12 | (2006.01) |
| H03D 7/14 | (2006.01) |
| H04B 1/18 | (2006.01) |
| H04B 1/30 | (2006.01) |

(52) U.S. Cl.
CPC . *H04L 27/14* (2013.01); *H04B 1/18* (2013.01); *H04B 1/30* (2013.01); *H03B 5/1228* (2013.01); *H03B 5/1212* (2013.01); *H03D 7/1441* (2013.01); *H03D 7/1458* (2013.01); *H03D 2200/0023* (2013.01); *H03B 5/124* (2013.01)

(58) Field of Classification Search
CPC .. H03B 5/1271; H03B 5/1209; H03B 5/1253; H03B 5/1228; H03B 5/1212; H03F 3/45179; H04L 27/14; H04B 1/18; H04B 1/30; H03D 2200/0023; H03D 7/1441; H03D 7/1458
See application file for complete search history.

(56) References Cited

U.S. PATENT DOCUMENTS 3,646,421 A * 2/1972 Ogg .............................. 318/654
5,426,368 A * 6/1995 Benimeli et al. .............. 324/366

OTHER PUBLICATIONS

Rong-Fu Ye et al., Highly Sensitive and Low Power Injection-Locked FSK Receiver for Short-Range Wireless Applications, IEEE Radio Frequency Integrated Circuits Symposium, 2012, pp. 377-380.

\* cited by examiner

*Primary Examiner* — Daniel Washburn
*Assistant Examiner* — Eboni Hughes
(74) *Attorney, Agent, or Firm* — WPAT, P.C.; Anthony King

(57) ABSTRACT

The present invention relates to an injection-locked RF receiver having trifilar transformer splitter. The injection-locked RF receiver includes a trifilar transformer splitter, an injection-locked oscillator and a phase detector. The trifilar transformer splitter includes a primary winding, a secondary winding and a tertiary winding. RF input signal is input to the primary winding. The secondary winding outputs a first differential signal to the injection-locked oscillator. The tertiary winding outputs a second differential signal to the phase detector. Using the trifilar transformer splitter of the invention, the frequency-shift keying demodulation with high sensitivity is achieved, and the number of amplifier can be reduced so as to lower the power consumption of the injection-locked RF receiver and reduce the complexity of the involved system.

9 Claims, 4 Drawing Sheets

INJECTION-LOCKED RF RECEIVER HAVING TRIFILAR TRANSFORMER SPLITTER

BACKGROUND OF THE INVENTION

1. Field of the Invention

The present invention relates to an injection-locked RF receiver having trifilar transformer splitter.

2. Description of the Related Art

The conventional RF receiver for digital modulation signal, for example a quadrature demodulation receiver, is classified as a coherent demodulation receiver. It divides the receiving signal into in-phase demodulation path and quadrature-phase demodulation path, and utilizes a local oscillation unit to synchronize with the receiving signal. Therefore, it has stable demodulation quality and high sensitivity for RF operation. However, the conventional scheme must utilize one local oscillation unit to lead high power consumption, thus it can not be used for low power consumption requirement of short-range wireless systems.

The conventional injection-locked technique can obtain frequency demodulation. By conversion of frequency and amplitude, the conventional injection-locked receiver can demodulate digital modulation formation of frequency modulation. However, the demodulation bandwidth of the conventional injection-locked receiver is limited by the injection-locked bandwidth. The injection-locked oscillation technique can non-coherent demodulate digital modulation formation for frequency modulation (FM), amplitude-shift keying (ASK) and frequency-shift keying (FSK) etc. However, the above schemes are limited by the injection-locked bandwidth of the injection-locked oscillator, thus it is difficult that they can obtain high sensitivity requirement for wireless communication system.

Therefore, it is necessary to provide an injection-locked RF receiver having trifilar transformer splitter to solve the above problems.

SUMMARY OF THE INVENTION

The present invention provides an injection-locked RF receiver having trifilar transformer splitter. The injection-locked RF receiver includes a trifilar transformer splitter, an injection-locked oscillator and a phase detector. The trifilar transformer splitter has a primary winding, a secondary winding and a tertiary winding. The trifilar transformer splitter receives an RF input signal inputted to the primary winding. The secondary winding outputs a first differential signal. The tertiary winding outputs a second differential signal. The injection-locked oscillator is connected to the secondary winding, and generates a differential oscillation current signal according to the first differential signal. The phase detector is connected to the tertiary winding and the injection-locked oscillator, and generates an amplitude signal according to the second differential signal and the differential oscillation current signal.

By using the trifilar transformer splitter, the first differential signal and the second differential signal are inputted respectively into the injection-locked oscillator and the phase detector to achieve high sensitivity operation for FSK demodulation. The secondary winding can be the resonance inductor of the injection-locked oscillator so as to obtain compact integrated performance. Furthermore, by using the trifilar transformer splitter of the invention, the number of the amplifier can be reduced to lower the power consumption of the entire injection-locked RF receiver and to decrease the complexity of the involved system. Therefore, the injection-locked RF receiver of the invention is suitable for short-range wireless communication or wireless sensor network applications.

DETAILED DESCRIPTION OF THE INVENTION

Figure 1:
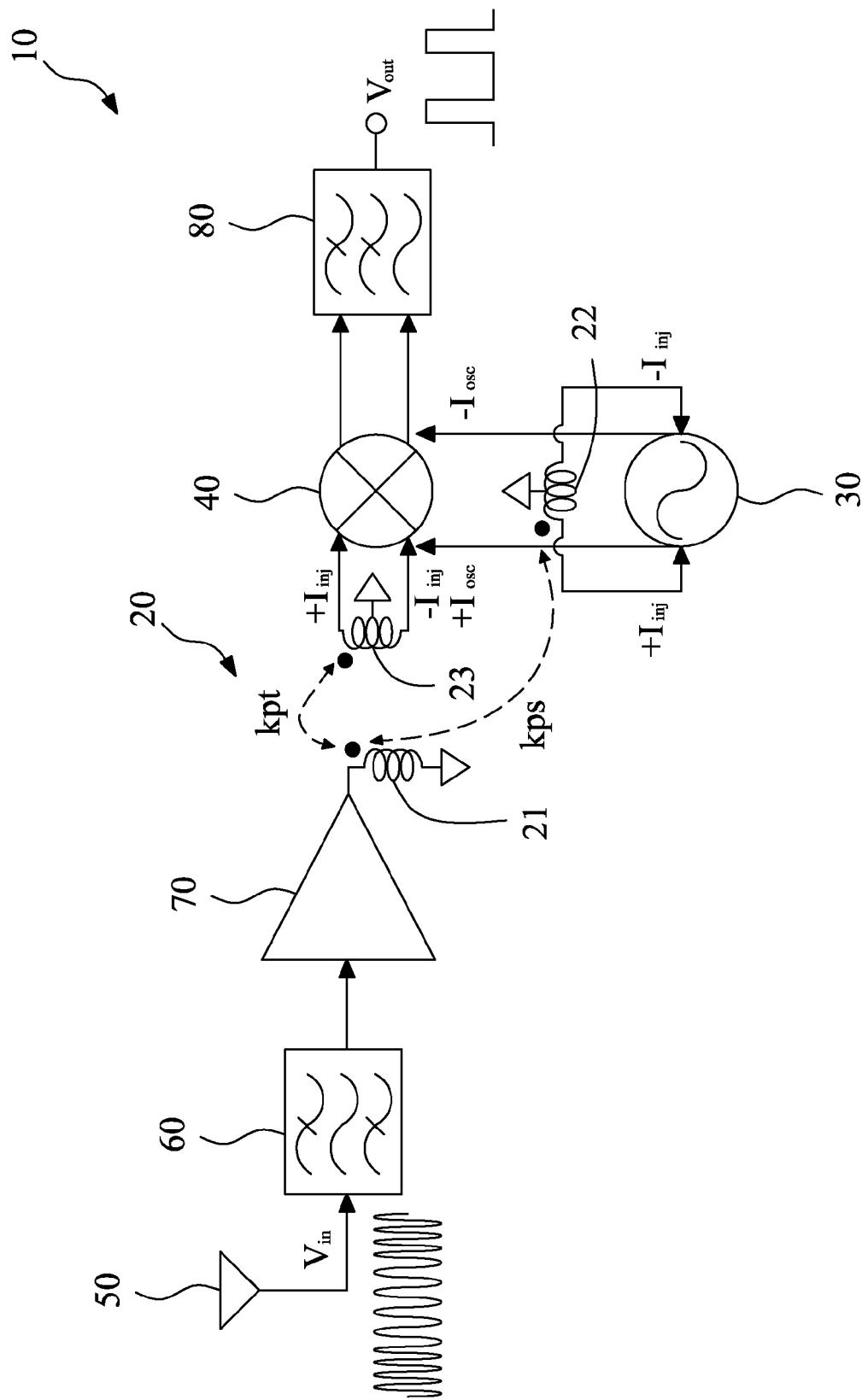
FIG. 1 shows a block diagram of injection-locked RF receiver having trifilar transformer splitter according to the present invention.

Referring to FIG. 1, it shows a block diagram of injection-locked RF receiver having trifilar transformer splitter according to the present invention. The injection-locked RF receiver 10 of the present invention includes a trifilar transformer splitter 20, an injection-locked oscillator 30 and a phase detector 40. The trifilar transformer splitter 20 has a primary winding 21, a secondary winding 22 and a tertiary winding 23. The trifilar transformer splitter 20 receives an RF input signal inputted to the primary winding 21. The secondary winding 22 outputs a first differential signal. The tertiary winding 23 outputs a second differential signal. In this embodiment, the first differential signal and the second differential signal are classified to be differential signal with same amplitude and are shown as $+I_{inj}$ and $-I_{inj}$.

The injection-locked oscillator 30 is connected to the secondary winding 22, and generates a differential oscillation current signal ($+I_{osc}$ and $-I_{osc}$) according to the first differential signal. The phase detector 40 is connected to the tertiary winding 23 and the injection-locked oscillator 30, and generates an amplitude signal according to the second differential signal and the differential oscillation current signal.

In this embodiment, the injection-locked RF receiver 10 of the present invention further includes an antenna 50, a bandpass filter 60 and an amplifier 70. The antenna 50, the bandpass filter 60 and the amplifier 70 are connected in series. The antenna 50 is used for receiving a RF receiving signal and for inputting the RF receiving signal into the bandpass filter 60 for filtering noise and interfere signal, then outputting to the amplifier 70 for amplifying the RF receiving signal to be the RF input signal. In this embodiment, the amplifier 70 is a low noise amplifier.

The injection-locked RF receiver 10 of the present invention further includes a low pass filter 80 connected to the phase detector 40 and generating an output signal Vout according to the amplitude signal.

By using the trifilar transformer splitter 20 of the injection-locked RF receiver 10, the first differential signal and the second differential signal are inputted respectively into the injection-locked oscillator 30 and the phase detector 40 to achieve high sensitivity operation for FSK demodulation. The secondary winding 22 can be the resonance inductor of the injection-locked oscillator 30 so as to obtain compact integrated performance. Furthermore, by using the trifilar transformer splitter 20 of the invention, the number of the amplifier can be reduced to lower the power consumption of the entire injection-locked RF receiver and to decrease the complexity of the involved system. Therefore, the injection-locked RF receiver 10 of the invention is suitable for short-range wireless communication or wireless detection application.

Figure 2:
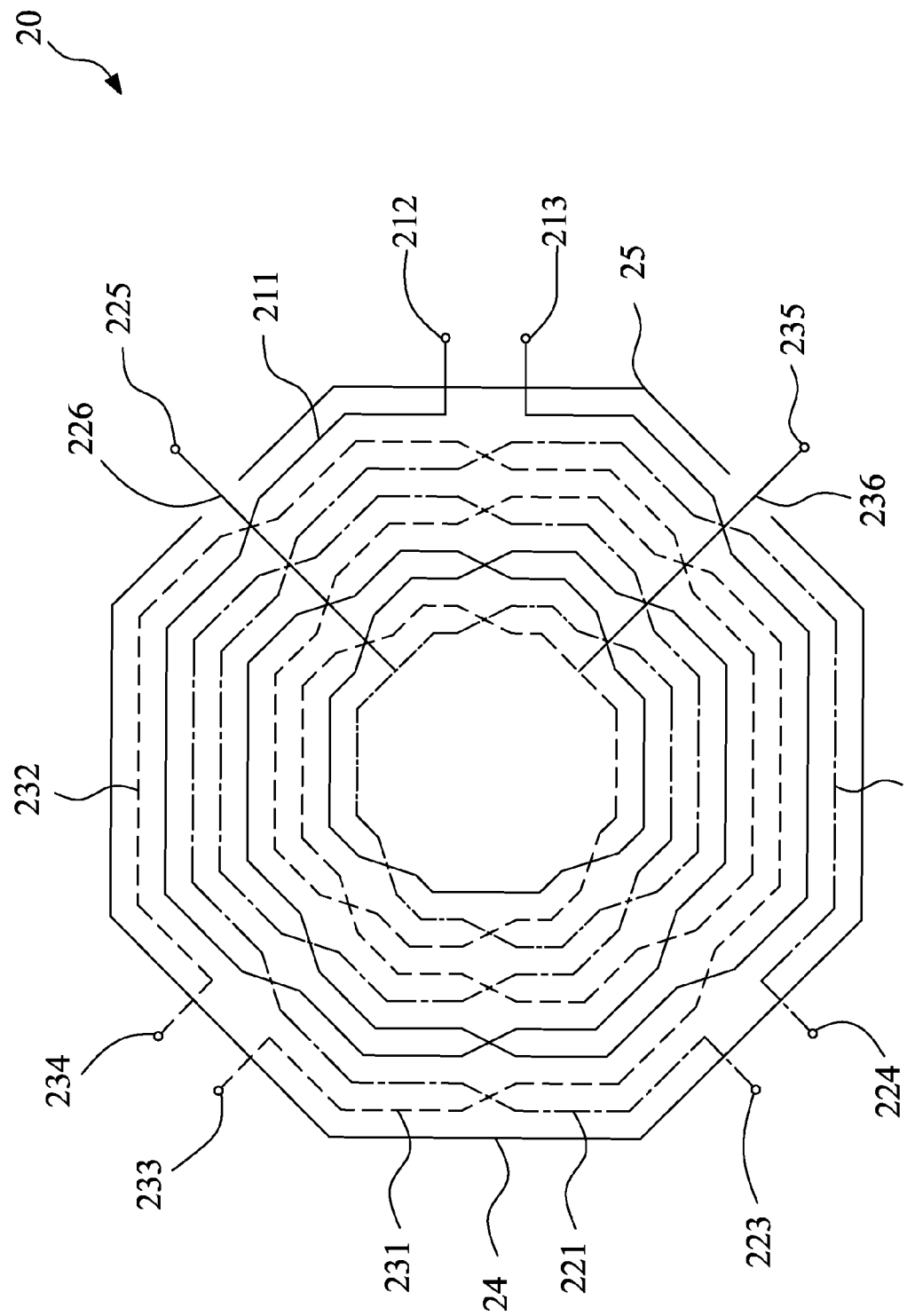
FIG. 2 shows a layout structure schematic view of the trifilar transformer splitter according to the present invention.
Figure 3:
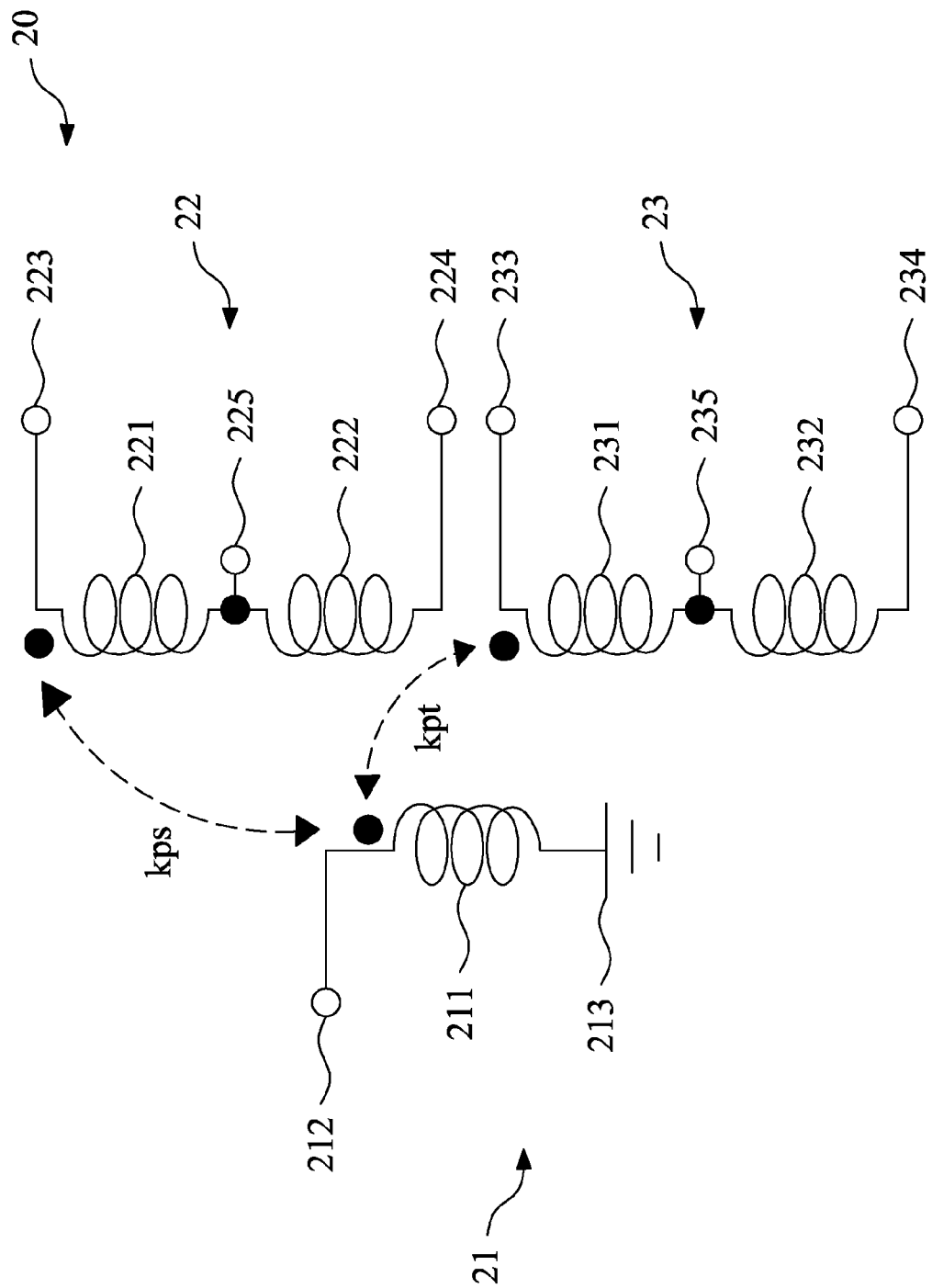
FIG. 3 shows an equivalent circuit of the trifilar transformer splitter according to the present invention.

FIG. 2 shows a layout structure schematic view of the trifilar transformer splitter according to the present invention. FIG. 3 shows an equivalent circuit of the trifilar transformer splitter according to the present invention. Referring to FIG. 2 and FIG. 3, the signal of the primary winding 21 is coupled to the secondary winding 22 and the tertiary winding 23 respectively by the electromagnetic coupling path $k_{pt}$ and $k_{ps}$. The primary winding 21 includes a primary metal section 211 and two terminals 212 and 213, one terminal 213 is a AC grounding terminal and the other terminal 212 is used for inputting the RF input signal.

The secondary winding 22 includes two secondary metal sections 221, 222, two terminals 223, 224 and a center tap 225. The two terminals 223, 224 of the secondary winding 22 output the first differential signal. The center tap 225 of the secondary winding 22 is connected to a DC bias. The secondary winding 22 further includes a metal section 226 connected to the center tap 225.

The tertiary winding 23 includes two tertiary metal sections 231, 232, two terminals 233, 234 and a center tap 235. The two terminals 233, 234 of the tertiary winding 23 output the second differential signal. The center tap 235 of the tertiary winding 23 is a AC grounding terminal. The tertiary winding 23 further includes a metal section 236 connected to the center tap 235. Furthermore, the trifilar transformer splitter 20 further includes two grounding metal rings 24, 25.

Figure 4:
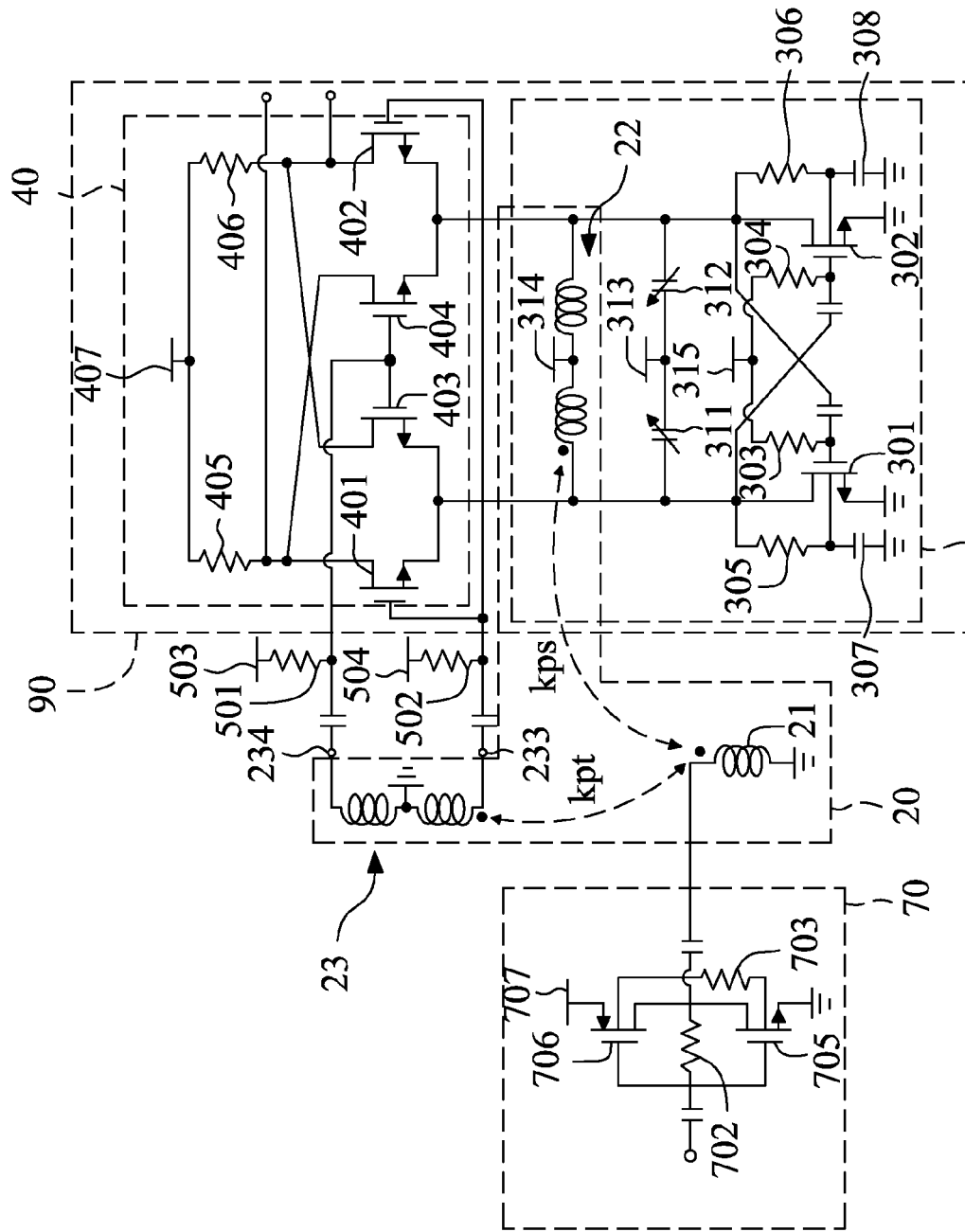
FIG. 4 shows a circuit schematic view of the injection-locked RF receiver according to the present invention.

Referring to FIG. 4, it shows a circuit schematic view of the injection-locked RF receiver according to the present invention. The amplifier 70 includes a N-type MOSFET (Metal-Oxide-Semiconductor Field-Effect Transistor) 705 and a P-type MOSFET 706 to form a complementary current reusable low noise amplifier scheme. The amplifier 70 further includes a resistor 703 connected to the body terminal of the N-type MOSFET 705 and the P-type MOSFET 706 so as to lower the threshold voltage of the N-type MOSFET 705 and the P-type MOSFET 706 by appropriate design, thus the amplifier 70 can work at 0.8 V operation voltage 707. Furthermore, the amplifier 70 further includes a self-feedback resistor 702 chosen to trade off between noise figure and input-matching.

After the RF receiving signal inputs to the amplifier 70, the RF receiving signal is amplified then is outputted to the primary winding 21 of the trifilar transformer splitter 20. The signal of the primary winding 21 is coupled to the secondary winding 22 and the tertiary winding 23 respectively by the electromagnetic coupling path $k_{pt}$ and $k_{ps}$. The secondary winding 22 and the tertiary winding 23 respectively output differential signal ($+I_{inj}$ and $-I_{inj}$) with same amplitude to the injection-locked oscillator 30 and the phase detector 40.

The injection-locked oscillator 30 includes an active part, a body-biasing network and a resonance part. The active part includes two N-type MOSFETs 301, 302 and two first resistors 303, 304, the two first resistors 303, 304 are connected to gates of the two N-type MOSFETs 301, 302. The body-biasing network includes two second resistors 305, 306 and two first capacitors 307, 308, the second resistor 305 and the first capacitor 307 are connected in series and the second resistor 306 and the first capacitor 308 are connected in series to bias the body of two N-type MOSFETs 301, 302. The resonance part includes two variable capacitors 311, 312 and the secondary winding 22, control voltages of the two variable capacitors 311, 312 are controlled by a bias voltage 313. An operation voltage of the injection-locked oscillator 30 is controlled by the DC bias 314, and the center tap of the secondary winding 22 is connected to the DC bias 314.

In this embodiment, the phase detector 40 is a Gilbert-cell switch stage circuit, and the phase detector 40 is stacked on the injection-locked oscillator 30 to form an injection-locked self-oscillating mixer 90.

The phase detector 40 includes four N-type FETs 401, 402, 403, 404 and two load resistor 405, 406. The phase detector 40 includes a first N-type FET 401, a second N-type FET 402, a third N-type FET 403 and a fourth N-type FET 404. Gates of the first N-type FET 401 and the second N-type FET 402 are connected and connected to one terminal 233 of the tertiary winding 23. Gates of the third N-type FET 403 and the fourth N-type FET 404 are connected and connected to the other terminal 234 of the tertiary winding 23. Sources of the first N-type FET 401 and the third N-type FET 403 are connected, and sources of the second N-type FET 402 and the fourth N-type FET 404 are connected, they are connected to differential oscillation current signal of the injection-locked oscillator 30 respectively.

The two load resistor 405, 406 are connected to a DC voltage 407, and connected to drains of the first N-type FET 401 and the fourth N-type FET 404, and drains of the second N-type FET 402 and the third N-type FET 403 respectively.

The injection-locked RF receiver 10 of the invention further includes two bias resistor 501, 502 connected to two bias voltage 503, 504 respectively and connected to two terminals 233, 234 of the tertiary winding 23 respectively.

Compared with the conventional FSK demodulation receiver, for example the quadrature demodulation receiver, the injection-locked RF receiver of the invention can demodulate the digital modulation signal without the extra carrier recovery circuit. Therefore, the injection-locked RF receiver of the invention has the advantage of simple structure, and is suitable for performing the ultra-low power consumption and high energy efficiency receiver.

The injection-locked RF receiver of the invention utilizes the current reusable injection-locked self-oscillating mixing stack structure and the trifilar transformer splitter, and the injection-locked self-oscillating mixer operates at the sub-threshold region to increase the demodulation sensitivity of the entire receiver. Because the injection-locked RF receiver of the invention has the performance of high sensitivity for RF character, it can reduce the load of processing signal for baseband circuit at the next stage and promote the demodulation quality of the entire signal.

The injection-locked RF receiver of the invention provides excellent RF character with high sensitivity and low power consumption, and has unique performance with simple structure, easy integrated circuit technology and minimization. Therefore, the injection-locked RF receiver of the invention is suitable for RF front end receiver at short-range wireless communication system.

While several embodiments of the present invention have been illustrated and described, various modifications and improvements can be made by those skilled in the art. The embodiments of the present invention are therefore described in an illustrative but not in a restrictive sense. It is intended that the present invention should not be limited to the particular forms as illustrated and that all modifications which maintain the spirit and scope of the present invention are within the scope defined in the appended claims.

What is claimed is:

1. An injection-locked RF receiver having trifilar transformer splitter, comprising:
   a trifilar transformer splitter, having a primary winding, a secondary winding and a tertiary winding, the trifilar transformer splitter receiving an RF input signal inputted to the primary winding, the secondary winding outputting a first differential signal and the tertiary winding outputting a second differential signal;

an injection-locked oscillator, connected to the secondary winding and generating a differential oscillation current signal according to the first differential signal; and a phase detector, connected to the tertiary winding and the injection-locked oscillator and generating an amplitude signal according to the second differential signal and the differential oscillation current signal.

2. The injection-locked RF receiver according to claim 1, further comprising an antenna, a bandpass filter and an amplifier, the antenna, the bandpass filter and the amplifier connected in series, the antenna for receiving a RF receiving signal and for inputting the RF receiving signal into the bandpass filter for filtering noise and interfere signal then outputting to the amplifier for amplifying the RF receiving signal to be the RF input signal.

3. The injection-locked RF receiver according to claim 1, wherein the primary winding comprises two terminals, one terminal is a AC grounding terminal and the other terminal is used for inputting the RF input signal; the secondary winding comprises two terminals and a center tap, two terminals of the secondary winding output the first differential signal, the center tap of the secondary winding is connected to a DC bias; the tertiary winding comprises two terminals and a center tap, two terminals of the tertiary winding output the second differential signal, the center tap of the tertiary winding is a AC grounding terminal.

4. The injection-locked RF receiver according to claim 1, wherein the injection-locked oscillator comprises:

an active part, comprising two N-type MOSFETs and two first resistors, the two first resistors connected to gates of the two N-type MOSFETs;

a body-biasing network, comprising two second resistors and two first capacitors, the second resistor and the first capacitor are connected in series to bias the body of two N-type MOSFETs; and a resonance part, comprising two variable capacitors and the secondary winding, control voltages of the two variable capacitors are controlled by a bias voltage.

5. The injection-locked RF receiver according to claim 3, wherein a operation voltage of the injection-locked oscillator is controlled by the DC bias.

6. The injection-locked RF receiver according to claim 1, wherein the phase detector is a Gilbert-cell switch stage circuit, and the phase detector is stacked on the injection-locked oscillator to form an injection-locked self-oscillating mixer.

7. The injection-locked RF receiver according to claim 3, wherein the phase detector comprises:

four N-type FETs, having a first N-type FET, a second N-type FET, a third N-type FET and a fourth N-type FET, gates of the first N-type FET and the second N-type FET are connected and connected to one terminal of the tertiary winding; gates of the third N-type FET and the fourth N-type FET are connected and connected to the other terminal of the tertiary winding; sources of the first N-type FET and the third N-type FET are connected, and sources of the second N-type FET and the fourth N-type FET are connected, they are connected to the differential oscillation current signal of the injection-locked oscillator respectively; and two load resistor, connected to a DC voltage, and connected to drains of the first N-type FET and the fourth N-type FET, and drains of the second N-type FET and the third N-type FET respectively.

8. The injection-locked RF receiver according to claim 3, further comprising two bias resistor, connected to two bias voltage respectively and connected to two terminals of the tertiary winding respectively.

9. The injection-locked RF receiver according to claim 1, further comprising a low pass filter, connected to the phase detector and generating an output signal according to the amplitude signal.

\* \* \* \* \*